United States Patent
Hönigschmid et al.

(10) Patent No.: US 6,816,406 B2
(45) Date of Patent: Nov. 9, 2004

(54) MAGNETIC MEMORY CONFIGURATION

(75) Inventors: Heinz Hönigschmid, Essex Junction, CT (US); Helmut Kandolf, München (DE); Stefan Lammers, Heek (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/715,023

(22) Filed: Nov. 17, 2003

(65) Prior Publication Data

US 2004/0100836 A1 May 27, 2004

Related U.S. Application Data

(63) Continuation of application No. PCT/DE02/01751, filed on May 15, 2002.

(30) Foreign Application Priority Data

May 15, 2001 (DE) .......................................... 101 23 593

(51) Int. Cl.[7] ................................................ G11C 11/14
(52) U.S. Cl. ........................ 365/171; 365/173; 365/158; 365/161
(58) Field of Search ................................ 365/171, 173, 365/158, 161

(56) References Cited

U.S. PATENT DOCUMENTS

| | | | |
|---|---|---|---|
| 6,034,887 A | 3/2000 | Gupta et al. | |
| 6,097,626 A | 8/2000 | Brug et al. | |
| 6,111,783 A | 8/2000 | Tran et al. | |
| 6,134,138 A | 10/2000 | Lu et al. | |
| 6,178,131 B1 | 1/2001 | Ishikawa et al. | |
| 6,473,336 B1 * | 10/2002 | Nakajima et al. | ........... 365/171 |
| 6,515,896 B1 * | 2/2003 | Tran | ........................... 365/171 |
| 6,522,578 B2 | 2/2003 | Poechmueller | |
| 2002/0080643 A1 | 6/2002 | Ito | |

FOREIGN PATENT DOCUMENTS

DE          100 32 278 C1          11/2001

* cited by examiner

*Primary Examiner*—Richard Elms
*Assistant Examiner*—Toan Le
(74) *Attorney, Agent, or Firm*—Laurence A. Greenberg; Werner H. Stemer; Ralph E. Locher

(57) ABSTRACT

A magnetic memory configuration stores data and avoids ageing effects. The memory configuration contains a cell array containing magnetic memory cells disposed along a first direction and a second direction crossing the former, a multiplicity of electrical lines along the first direction, and a multiplicity of electrical lines along the second direction. The magnetic memory cells in each case are disposed at crossover points of the electrical lines. A first current supply device supplies respectively selected electrical lines along the first direction with current. A second current supply device supplies respectively selected electrical lines along the second direction with current. The second current supply device is configured for setting the direction of the current in accordance with an information item to be written. The first current supply device is suitable for changing over the direction of the current as desired.

8 Claims, 4 Drawing Sheets

MAGNETIC MEMORY CONFIGURATION

CROSS-REFERENCE TO RELATED APPLICATION

This application is a continuation of copending International Application No. PCT/DE02/01751, filed May 15, 2002, which designated the United States and was not published in English.

BACKGROUND OF THE INVENTION

FIELD OF THE INVENTION

The present invention relates to a magnetic memory configuration for storing data.

A magnetic memory such as a magnetic random access memory (MRAM) is a nonvolatile memory for the long-term storage of data.

A typical magnetic memory configuration, as is shown for example in FIG. 3, contains a memory cell array in which the individual memory cells are disposed in a matrix form. Word lines extend along the rows of the memory cell array, and bit lines extend along the columns of the memory cell array. The memory cells, in which the information is stored, are situated at the crossover points of the individual word and bit lines.

A magnetic memory cell usually has a construction in which two ferromagnetic layers are separated by a nonmagnetic layer. The magnetic field in one ferromagnetic layer (a magnetically hard layer) is fixed, while the direction of the magnetic field in the other ferromagnetic layer (a magnetically soft layer) can be set parallel or antiparallel thereto. These two stable orientations, parallel and antiparallel, represent the logic values "0" and "1" in the storage of information items.

The direction of the magnetic field in the soft layer in a selected memory cell can be changed by applying a current to a word line and a bit line which cross at the memory cell. The currents generate magnetic fields which, if they are combined, can change over the magnetization direction of the soft layer of the selected memory cell from parallel to antiparallel, or vice versa. A magnetic field that does not suffice for changing over the magnetization direction in the soft layer acts on all the other memory cells along the word and bit lines that cross at the selected memory cell.

In this case, in customary memory cells, the direction of the current flowing through the word line is always the same, while the direction of the current flowing through the bit line is altered depending on the information to be written.

FIGS. 2A and 2C illustrate the magnetic fields caused by the respective currents in a conventional memory configuration, while FIGS. 2B and 2D illustrate the orientation of the magnetic fields in the ferromagnetic layers. In FIGS. 2B and 2D, reference symbol 1 in each case designates the hard magnetic layer, and reference symbol 2 in each case designates the soft magnetic layer.

In FIG. 2A, the direction of the current flowing through the bit line corresponds to a logic "0", while it corresponds to a logic "1" in FIG. 2C. In this case, WL indicates the magnetic field generated by the current flowing through the word line, while $BL_0$ and $BL_1$ respectively indicate the magnetic field generated by the current flowing through the bit line. $H_0$ and $H_1$ in each case indicate the magnetic field resulting from the superposition of the two magnetic fields.

Consequently, a parallel state of the magnetic fields in the two layers is present in FIG. 2B, while an antiparallel state of the magnetic fields in the two layers is present in FIG. 2D.

In accordance with the orientation of the magnetic field in the soft layer of the selected memory cell, the memory cell has different resistances perpendicular to the layer planes. The information stored in a memory cell can thus be read out by determining the resistance perpendicular to the layer planes.

Impairments brought about by ageing are problematic in magnetic memory cells. An example is the occurrence of the effect wherein after relatively long use, non-selected memory cells are also changed over by a current being switched-on on the word line and do not return to their initial position again after the current has been switched-off. The effect wherein memory cells to which a "1" has been multiply written still store a "1" in the event of a "0" being written is likewise known. Furthermore, it is known that after relatively long use, even the magnetization direction of the magnetically hard layer can be altered, which likewise leads to erroneous information storage.

U.S. Pat. No. 6,111,783 discloses a magnetic memory cell configuration in which, when writing information, the intensity of the current through the word lines is greater than the intensity of the current through the bit lines. On the one hand this prevents the magnetic field in the soft layer of non-selected memory cells from being changed over, and on the other hand this also reduces the energy consumption of the memory cell.

SUMMARY OF THE INVENTION

It is accordingly an object of the invention to provide a magnetic memory configuration that overcomes the above-mentioned disadvantages of the prior art devices of this general type, in which the ageing phenomena mentioned above are reduced.

With the foregoing and other objects in view there is provided, in accordance with the invention, a magnetic memory configuration. The magnetic memory configuration contains a cell array having magnetic memory cells disposed along a first direction and a second direction crossing the first direction, a multiplicity of electrical lines disposed along the first direction, and a multiplicity of electrical lines disposed along the second direction. The magnetic memory cells are in each case disposed at crossover points of the electrical lines. A first current supply device is provided and supplies respectively selected electrical lines along the first direction with a first current. The first current supply device is configured for changing over a direction of the first current. A second current supply device is provided and supplies respectively selected electrical lines along the second direction with a second current. The second current supply device sets a direction of the second current in accordance with an information item to be written.

Through a simple change in the direction of the current flowing through the word line, it is possible to avoid the effect wherein non-selected memory cells are changed over by the magnetic field of the word line.

Normally, the soft magnetic layer of the memory cell is deflected from its stable position by the magnetic field caused by the current flowing through the word line and is then switched either into the opposite stable position or into its initial position by the magnetic field caused by the current flowing through the bit line. In cells which see a bit line field, i.e. a switching field, it is expected that although they are deflected (enabled) by the applied word line field, they then switch back into their initial position again. Upon multiple repetition of this process it can happen that not all the domains then return to their initial position. This effect is avoided by rotating the direction of the current flowing through the word line.

A further advantage of the present invention is that electromigration effects can be avoided by the arbitrary changeover of the direction of the current through the word line. In the case of aluminum interconnects, in particular, a material migration occurs in interconnects under the influence of an electric current flow. The material transport is physically caused by collisions between moving electrons and the positive metal ions of the crystal lattice. Consequently, the material transport always takes place in the direction of the electron flow and counter to the technical current direction. If the current direction is reversed relatively often as in the case of the present invention, then this material migration, which might otherwise lead to an interruption of the interconnect, can be avoided.

In a development of the concept of the invention a plurality of layers of memory cells may be disposed one above the other. A first memory cell is disposed above a line running in the first direction. Disposed above that is a line running in the second direction. Situated above that in turn is a further memory cell, above which is disposed a line running in the first direction. The line disposed between the two layers of magnetic memory cells is connected to the current supply device that changes over the direction of the current. In this case, the central line plane undertakes the enable function for the memory cell layer disposed above and below it.

In accordance with an added feature of the invention, the first current supply device contains a counting device for counting accesses to one of the electrical lines in the first direction and reverses a current direction after a predetermined number of accesses to the one electrical line in the first direction for an next access.

In accordance with a further feature of the invention, the electrical lines along the first direction are word lines, and the first current supply device, for each one of the word lines along the first direction, contains in each case two inverters having outputs and inputs. Each of the word lines is disposed between the outputs of the two inverters. The first supply device further has a control device for feeding in each case one of two logic levels to the inputs of the two inverters depending on a desired current direction.

In accordance with an additional feature of the invention, the first current supply device for each of the electrical lines along the first direction, contains in each case a first and a second voltage source, at least two selection transistors with controlled paths, and a control device controlling the first and second voltage sources such that the first voltage source provides a high voltage signal and the second voltage source provides a low voltage signal (and vise versa) which are applied to the controlled paths of the selection transistors.

In accordance with another feature of the invention, the electrical lines along the first direction are word lines, and the controlled paths have terminals and one of the word lines is connected between the terminals of the controlled paths of the selection transistors.

Other features which are considered as characteristic for the invention are set forth in the appended claims.

Although the invention is illustrated and described herein as embodied in a magnetic memory configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 3:
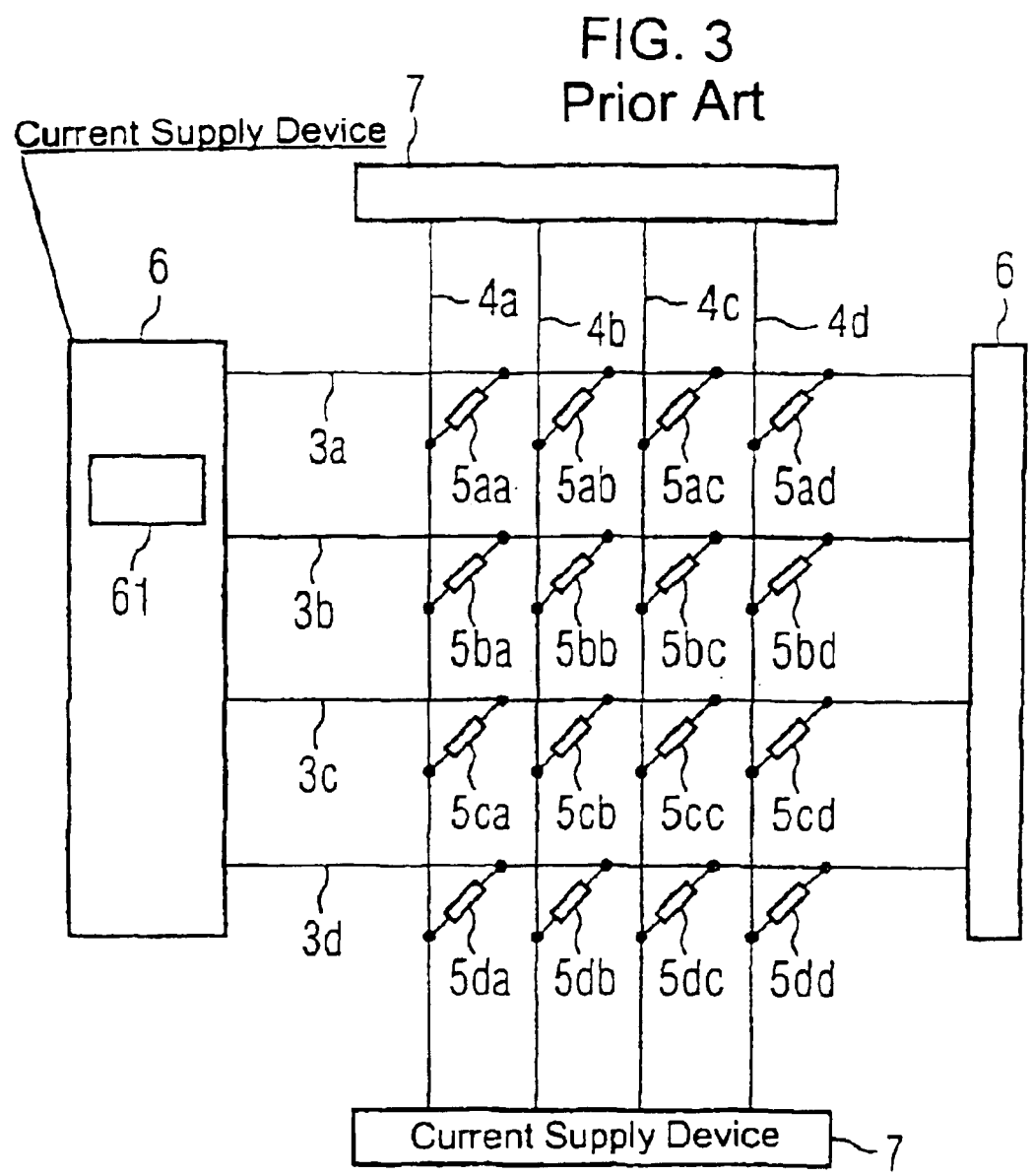
FIG. 3 schematically shows the construction of a magnetic memory configuration according to the prior art.

Referring now to the figures of the drawing in detail and first, particularly, to FIG. 3 thereof, there is shown by way of example the construction of a magnetic memory configuration with sixteen memory cells and in each case four word and bit lines. Magnetic memory configurations usually have significantly more memory cells, for example several tens of thousands of memory cells. In this case, the number of word lines need not be equal to the number of bit lines.

Reference symbols 3*a* to 3*d* in each case designate the word lines, and reference symbols 4*a* to 4*d* in each case designate the bit lines. Magnetic memory cells 5*aa* to 5*dd* are situated at crossover points between each word line and each bit line. A first current supply device 6 is provided for supplying current to the word lines 3*a*–3*d*, and a second current supply device 7 is provided for supplying current to the bit lines 4*a*–4*d*.

In order to write information to an individual selected memory cell, for example memory cell 5*ba*, a current that causes a specific magnetic field flows first through the word line 3*b*. A current that likewise causes a specific magnetic field then flows through the bit line 4*a*. In this case, the orientation of the magnetic field and thus the direction of the current corresponds to the information to be written, so that the free (soft) magnetic layer in memory cell 5*ba* is switched either into the initial position or the opposite position with respect thereto, in accordance with the information to be written.

After the respective currents have been switched off, the memory cells along the word line 3*b* or also along the bit line 4*a* that do not correspond to the selected memory cell 5*ba* return to their initial position again. By contrast the magnetization direction of the soft magnetic layer in the selected memory cell 5ba remains in the set state. The selected memory cell 5ba thus stores the information written in, which can subsequently be read out again by determining the resistance perpendicular to the direction of the ferromagnetic layers.

According to the present invention, the first current supply device 6 is now configured in such a way that it can change over the direction of the current flowing through the word line 3a–3d as desired. In particular, it may contain a counting device 61, for example, which counts the number of accesses to each individual word line and reverses the current direction after a specific number. By way of example, the current direction may be altered after every or after every second access to a specific word line.

This results in the advantageous effect wherein the ageing phenomena of the memory cells can be avoided, in particular wherein the non-selected memory cells lying on a word or bit line through which current flows return to their initial position again after the current has been switched off.

Figure 1A:
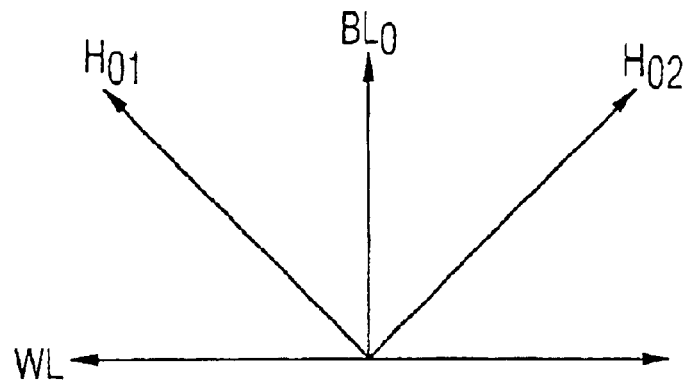
FIG. 1A and FIG. 1C illustrate magnetic fields caused by respective currents in the case of a magnetic memory configuration according to the invention.
Figure 1B:
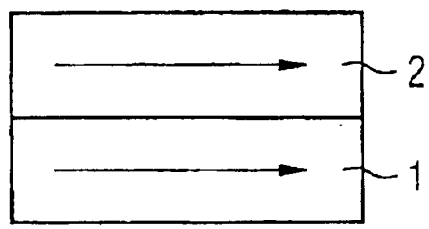
FIG. 1B and FIG. 1D correspondingly illustrate an orientation of the magnetic fields in ferromagnetic layers according to the invention.
Figure 1C:
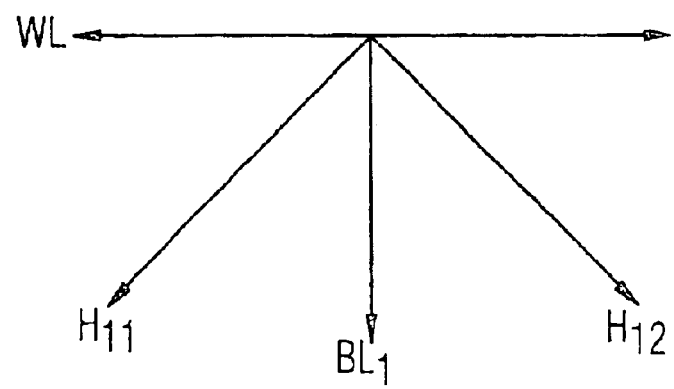
Figure 1D:
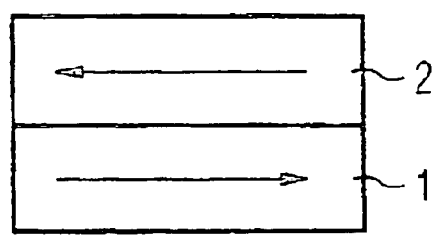
Figure 2A:
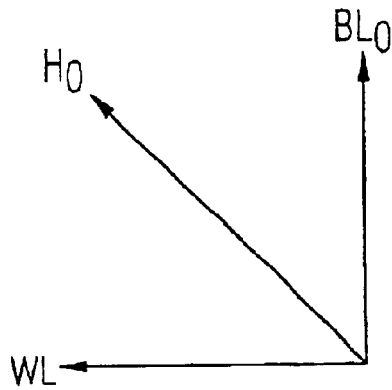
FIG. 2A and FIG. 2C illustrate the magnetic fields caused by the respective currents in the case of the magnetic memory configuration according to the prior art.
Figure 2B:
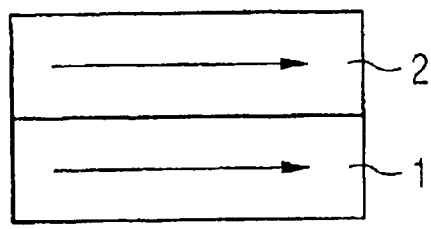
FIG. 2B and FIG. 2D correspondingly illustrate the orientation of the magnetic fields in the ferromagnetic layers according to the prior art.
Figure 2C:
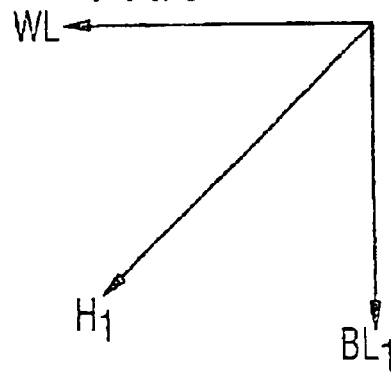
Figure 2D:
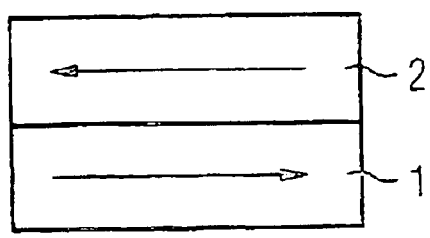

FIGS. 1A and 1C illustrate the magnetic fields caused by the respective currents in the memory configuration according to the invention, while FIGS. 1B and 1D illustrate the orientation of the magnetic fields in the ferromagnetic layers. In FIGS. 1B and 1D, the reference symbol 1 in each case designates the hard magnetic layer, and the reference symbol 2 in each case designates the soft magnetic layer.

In FIG. 1A, the direction of the current flowing through the bit line corresponds to a logic "0", while it corresponds to a logic "1" in FIG. 1C. In this case, WL indicates the magnetic field generated by the current flowing through the word line, while $BL_0$ and $BL_1$ respectively indicate the magnetic field generated by the current flowing through the bit line. $H_{01}$, $H_{02}$ and $H_{11}$, $H_{12}$ in each case indicate the magnetic field resulting from the superposition of the two magnetic fields.

Independently of the direction of the current flowing through the word line and thus the corresponding direction of the magnetic field in this plane, a parallel state of the magnetic fields in the two layers is present in FIG. 1B, while an antiparallel state of the magnetic fields in the two layers is present in FIG. 1D.

More precisely, according to the present invention, it is possible to impress on the bit line in a conventional manner a current whose direction is predefined solely by the information to be written, while the direction of the current flowing through the word line is changed over arbitrarily, that is to say independently of the information to be written.

Furthermore, changing over the direction of the current flowing through the word line makes it possible to avoid the disadvantageous effect when the magnetization direction of the magnetically hard layer is altered.

Overall, it can be established as a general principle that the ageing phenomena in which the state of a memory cell depends on its past can be reduced by increasing the isotropy of the operating conditions.

Figure 4A:
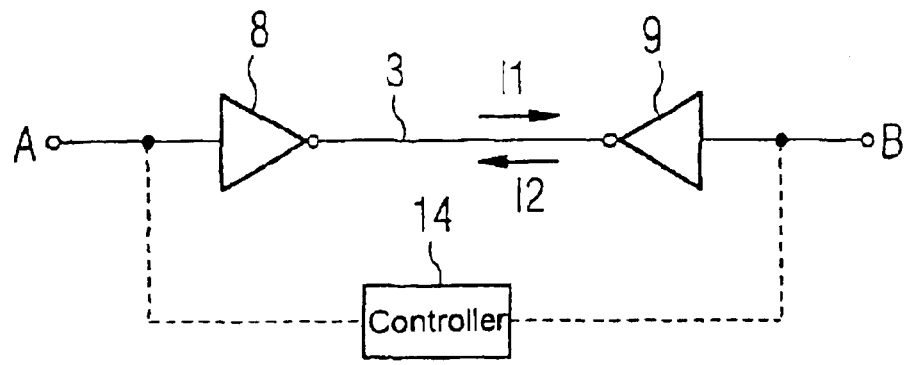
FIG. 4A illustrates a first exemplary configuration of a first current supply device according to the invention.
Figure 4B:
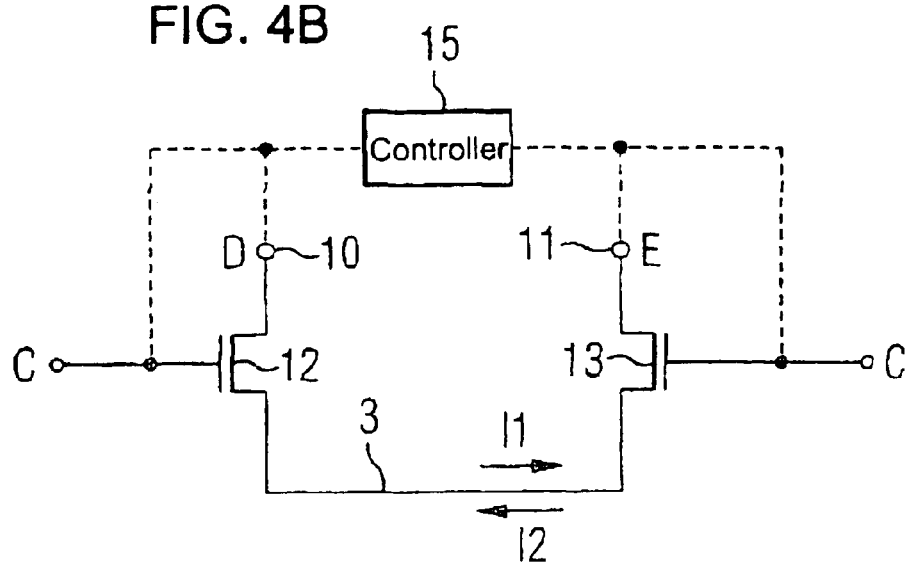
FIG. 4B illustrates a second exemplary configuration of the first current supply device according to the invention.

FIGS. 4A and 4B illustrate by way of example a first and a second configuration of the first current supply device 6. In this case, reference symbol 3 designates an arbitrary one of the word lines.

According to the present invention, the first current supply device 6 may be realized in such a way that it contains, for each word line, in each case two inverters 8, 9, the word line 3 being disposed between outputs of the two inverters 8, 9, and also a control device 14, which feeds in each case a logic "1" and/or "0" to inputs of the two inverters 8, 9 depending on the desired current direction. If a logic "1" is present at the input A of the inverter 8 and a logic "0" is present at the input B of the inverter 9, then a current direction I2 is directed from inverter 9 to inverter 8. In the opposite case, a current I1 flows from inverter 8 to inverter 9. If identical signals in each case "1" or "0" are present at both inputs A, B, then no current flows, i.e. the word line is not selected. A low level or a high level is present in the standby state. The function of the current supply device may be summarized as follows:

| A | B | Current |
|---|---|---------|
| 1 | 0 | I2 |
| 0 | 1 | I1 |
| 1 | 1 | Standby "0" |
| 0 | 0 | Standby "1" |

Consequently, it is possible to vary the current direction within the word line depending on what voltage level the control device 14 feeds to the two inverters 8, 9.

As an alternative, the first current supply device 6 may be realized in that the first current supply device, for each word line, contains in each case two voltage sources 10, 11, two selection transistors 12, 13 and also a control device 15. The selection transistors 12, 13 may be n-channel MOSFETs, for example, which, depending on the requirement, supply a suitable current for the word line and are equipped with a device for current limiting. The control device 15 controls the first and second voltage sources 10, 11 in such a way that the first voltage source 10 supplies a high voltage and the second voltage source 11 a low voltage, or vice versa, and the control device 15 switches the two selection transistors 12, 13 either to "conducting" or to "non-conducting" states.

In this case, too, it is possible to vary the current direction within the word line 3 depending on what voltage level D or E is respectively fed by the two voltage sources 10, 11.

If the voltage source 10 provides a high voltage D and the voltage source 11 provides a low voltage E, then the current direction I1 is directed from voltage source 10 to voltage source 11 provided that both selection transistors 12, 13 are switched to "conducting" by the signal C. The controlled paths of the transistors 12, 13 are connected to the voltage sources 10, 11 at one end and to the word line 3 at the other end. The control terminal of the transistors 12, 13 is in each case controlled by a control signal C that controls the transistors such that they are conducting or turned off. The current I2 flows in the opposite direction in the event of opposite distribution of the voltages D, E at the voltage sources 10, 11. If both selection transistors 12, 13 are switched to "turned off", no current flows, and the word line is not selected. The function of the circuit in FIG. 4B may be summarized as follows

| C | D | E | Current |
|---|---|---|---------|
| 1 | 1' | 0 | I1 |
| 1 | 0 | 1' | I2 |

The logic level "1" is 3 Volts, for example. The logic level "0" is 0 Volts, for example. The logic level "1'" is 1.8 Volts, for example. n-channel field-effect transistors 12, 13 are used for the example shown in FIG. 4B. Therefore, the signal C in the event of a logic "1" must have a higher potential than the voltages D or E provided.

Depending on the counting device 61 (FIG. 3), the current direction on an activated word line is reversed after a predefined number of accesses. The counter reading is altered, e.g. incremented, with every access, and, depending on the counter reading, the driving of the inverters in FIG. 4A by the signals A, B is reversed, or the voltages D, E in FIG. 4B are reversed.

Figure 5:
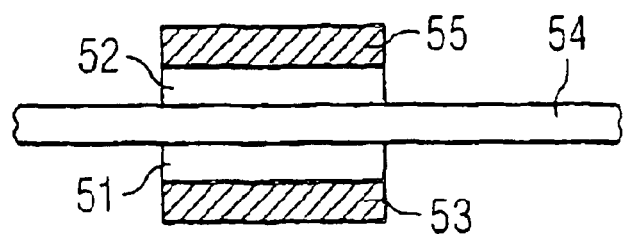
FIG. 5 shows a further configuration of the invention with two layers of magnetic memory cells disposed one above the other.

FIG. 5 shows a further embodiment of the invention with two layers of memory cells 51, 52. The lower plane of the memory cells, containing the memory cell 51, is disposed between the bit line 53 and the word line 54. The bit line 53 runs in a first direction perpendicular to the plane of the drawing. The word line 54 runs perpendicular thereto in a second direction, that is to say parallel to the plane of the drawing. A further magnetic memory cell 52 is disposed above the word line 54. A bit line 55 in turn runs above that in the first direction, that is to say perpendicular to the plane of the drawing. The central one of the lines, that is to say the word line 54, is the line that is affected by the current reversal. The line 54 is connected to the current supply device 6 in order to be changed over in the event of successive activations in accordance with the above-specified explanations concerning the invention.

We claim:

1. A magnetic memory configuration, comprising:
    a cell array having magnetic memory cells disposed along a first direction and a second direction crossing the first direction;
    a multiplicity of electrical lines disposed along the first direction;
    a multiplicity of electrical lines disposed along the second direction, said magnetic memory cells in each case being disposed at crossover points of said electrical lines;
    a first current supply device for supplying respectively selected said electrical lines along the first direction with a first current, said first current supply device being configured for changing over a direction of the first current; and
    a second current supply device for supplying respectively selected said electrical lines along the second direction with a second current, said second current supply device setting a direction of the second current in accordance with an information item to be written.

2. The magnetic memory configuration according to claim 1, wherein said first current supply device contains a counting device for counting accesses to one of said electrical lines in the first direction and reverses a current direction after a predetermined number of accesses to said one electrical line in the first direction for an next access.

3. The magnetic memory configuration according to claim 1, wherein:
    said electrical lines along the first direction are word lines; and
    said first current supply device, for each one of said word lines along the first direction, contains in each case two inverters having outputs and inputs, each of said word lines disposed between said outputs of said two inverters, said first supply device further having a control device for feeding in each case one of two logic levels to said inputs of said two inverters depending on a desired current direction.

4. The magnetic memory configuration according to claim 1, wherein said first current supply device for each of said electrical lines along the first direction, contains in each case a first and a second voltage source, at least two selection transistors with controlled paths, and a control device controlling said first and second voltage sources such that said first voltage source provides a high voltage signal and said second voltage source provides a low voltage signal which are applied to said controlled paths of said selection transistors.

5. The magnetic memory configuration according to claim 4, wherein:
    said electrical lines along the first direction are word lines; and
    said controlled paths have terminals and one of said word lines is connected between said terminals of said controlled paths of said selection transistors.

6. The magnetic memory configuration according to claim 1, wherein a respective one of said magnetic memory cells is disposed between one of said electrical lines along the first direction and one of said electrical lines along the second direction, and a further one of said magnetic memory cells is disposed above said one electrical line along the second direction, and a further one of said electrical lines runs above said further one of said magnetic memory cells.

7. The magnetic memory cell according to claim 6, wherein said further one of said electrical lines runs along the first direction.

8. The magnetic memory configuration according to claim 1, wherein said first current supply device for each of said electrical lines along the first direction, contains in each case a first and a second voltage source, at least two selection transistors with controlled paths, and a control device controlling said first and second voltage sources such that said first voltage source provides a low voltage signal and said second voltage source provides a high voltage signal which are applied to said controlled paths of said selection transistors.

* * * * *